United States Patent
Murphy et al.

(10) Patent No.: US 8,466,965 B2
(45) Date of Patent: Jun. 18, 2013

(54) WALL PLATE DIGITAL TELEVISION ANTENNA SIGNAL METER AND METHOD

(75) Inventors: Kevin Patrick Murphy, Palmyra, MO (US); Timothy Jay Linderer, Payson, IL (US)

(73) Assignee: Winegard Company, Burlington, IA (US)

( * ) Notice: Subject to any disclaimer, the term of this patent is extended or adjusted under 35 U.S.C. 154(b) by 10 days.

(21) Appl. No.: 13/280,039

(22) Filed: Oct. 24, 2011

(65) Prior Publication Data
US 2012/0127321 A1    May 24, 2012

Related U.S. Application Data

(60) Provisional application No. 61/415,009, filed on Nov. 18, 2010.

(51) Int. Cl.
*H04N 3/02*     (2006.01)
*F21V 33/00*    (2006.01)

(52) U.S. Cl.
USPC ............................................. 348/184; 362/95

(58) Field of Classification Search
USPC .................................... 348/184; 362/195, 95
See application file for complete search history.

(56) References Cited

U.S. PATENT DOCUMENTS

| | | | | |
|---|---|---|---|---|
| 5,371,550 A * | 12/1994 | Shibutani et al. | ............. | 348/570 |
| 5,940,028 A * | 8/1999 | Iwamura | ....................... | 342/359 |
| 6,097,441 A * | 8/2000 | Allport | ........................ | 348/552 |
| 6,389,070 B1 * | 5/2002 | Cugnini et al. | ............... | 375/232 |
| 6,580,452 B1 * | 6/2003 | Gangitano | ..................... | 348/180 |
| 6,856,798 B2 * | 2/2005 | Vitallo et al. | ................ | 455/345 |
| 7,275,254 B1 * | 9/2007 | Jutzi | .............................. | 725/72 |
| 7,584,494 B2 * | 9/2009 | Dow, III | .......................... | 725/81 |
| 2002/0033776 A1 * | 3/2002 | Kallina | ......................... | 343/711 |
| 2002/0199210 A1 | 12/2002 | Shi et al. | | |
| 2003/0014766 A1 | 1/2003 | Dinwiddie et al. | | |
| 2003/0228857 A1 * | 12/2003 | Maeki | ......................... | 455/278.1 |
| 2004/0145680 A1 * | 7/2004 | Bennett | ......................... | 348/570 |
| 2004/0183947 A1 * | 9/2004 | Lee | ................................ | 348/570 |
| 2005/0177848 A1 * | 8/2005 | Hyun | .............................. | 725/44 |
| 2006/0181455 A1 | 8/2006 | Hudson et al. | | |
| 2006/0195870 A1 * | 8/2006 | Teichner et al. | ................ | 725/75 |
| 2008/0151458 A1 * | 6/2008 | Beland et al. | ................ | 361/114 |
| 2008/0192418 A1 * | 8/2008 | Zambelli et al. | ............. | 361/681 |
| 2008/0309833 A1 * | 12/2008 | Nakamura et al. | ........... | 348/794 |
| 2010/0014277 A1 * | 1/2010 | Delany | ........................... | 362/95 |
| 2010/0033950 A1 * | 2/2010 | Farrell | ........................... | 362/95 |

(Continued)

OTHER PUBLICATIONS

Winegard Co., RV Wall Plate / Power Supply instructions (2 pages, rev. Jan. 2010).
King Controls, SureLock Digital TV Signal Finder (downloaded from www.kingcontrols.com/surelock/digital_tv_sign_finder.asp on Oct 20, 2010).
DIGIAIR User's Manual (US / CA Ver. Jul. 23, 2005).

*Primary Examiner* — Brian Yenke
(74) *Attorney, Agent, or Firm* — Dorr, Carson & Birney, P.C.

(57) ABSTRACT

A wall plate assembly having a television channel select switch, a channel display, and a signal strength display. A circuit board on the rear of the wall plate includes a television antenna connector, a television output connector, and control electronics. The control electronics displays the selected channel in the channel display, determines the signal strength for the selected channel in any signal on the television antenna connector and displays it in the signal strength display. The control electronics delivers the signal for the selected channel to the television output connector.

12 Claims, 11 Drawing Sheets

U.S. PATENT DOCUMENTS

| | | | |
|---|---|---|---|
| 2011/0028035 A1* | 2/2011 | McAllister | 439/579 |
| 2011/0253516 A1* | 10/2011 | Figueroa et al. | 200/297 |
| 2011/0283120 A1* | 11/2011 | Sivertsen | 713/300 |
| 2012/0007555 A1* | 1/2012 | Bukow | 320/110 |
| 2012/0008307 A1* | 1/2012 | Delany | 362/95 |
| 2012/0054814 A1* | 3/2012 | Porayath et al. | 725/110 |

* cited by examiner

WALL PLATE DIGITAL TELEVISION ANTENNA SIGNAL METER AND METHOD

RELATED APPLICATION

The present application is based on and claims priority to the Applicants' U.S. Provisional Patent Application 61/415,009, entitled "Wall Plate Digital Television Antenna Signal Meter And Method," filed on Nov. 18, 2010.

BACKGROUND OF THE INVENTION

1. Field of the Invention

The invention relates to a signal meter for a television antenna and, more particularly, the invention relates to a signal meter, mounted in a wall plate, for use with an antenna receiving broadcast television signals.

2. Discussion of the Background

Television antennas are now being used to receive digital broadcast VHF (very high frequency) and UHF (ultra high frequency) signals. Television antennas are found at fixed locations such as in residential housing and at temporary mobile locations such as occurs when a recreational vehicle (RV) moves around. In mobile use, a directional television antenna is usually mounted to the roof of the RV and when the RV stops at a new location, the directional television antenna must be oriented for optimum reception of broadcast digital television signals from local television stations. Conventional signal meters are available as an aid in proper orientation of the antenna by a user to receive a peak broadcast signal.

Such conventional signal meters are generally hand held and are temporarily connected to the antenna and sometimes to the television requiring the user to connect and disconnect cables. In an RV environment, the use of such hand-held signal meters is cumbersome with exposed cables and with the possibility that the signal meter may become misplaced or lost. A need exists for a signal meter built into a wall plate so that the signal meter is permanently located in a wall of the RV (or residential housing, etc.) and is convenient for use with all interconnecting cables hidden from view.

A television broadcast station's "radio frequency (RF) channel" may not be the same as the "viewing channel" on the television set. By way of example, in Burlington, Iowa, WQAD (an ABC affiliate) is known to viewers as Channel 8. With the mandate to convert to digital transmission, WQAD broadcasts its signal over RF channel 38 (614 to 620 MHz), but is assigned a virtual channel of 8.1. Newer TVs have built-in tuners that automatically scan (upon initial set-up) all broadcast digital RF frequencies and then map these detected broadcast RF channels into the virtual channels commonly used by the viewer. In the above example, the tuner detects RF channel 38, but then maps this as virtual channel 8 for use by the viewer who is familiar with the Channel 8 brand. This TV scan consumes time such as several minutes. Such long scan times are not practical when a directional antenna on the RV must be iteratively positioned to find TV signals. A need exists for a user, after parking an RV at a location, to ascertain available television programming quickly as the user iteratively orients the TV antenna to receive such local broadcast signals. The scan time for each iterative movement of the antenna should be less than 10 seconds and should provide the broadcast RF channel number and its signal strength. After the user properly aligns the antenna to receive a maximum signal strength for a desired channel(s), the user can then have the TV perform the much slower scan to tune the TV to the received broadcast signals and then map the detected broadcast channels to the virtual channels corresponding to the known viewing channel brands.

SUMMARY OF THE INVENTION

A wall plate assembly of the present invention has a channel select switch mounted through an opening which is operative from the front by a user to select a television channel. A channel display is mounted through another opening of the wall plate to display to the user the selected television channel. A signal strength display is also mounted through an opening to display the signal strength for the displayed selected channel. A circuit board mounted on the rear of the wall plate has a television antenna connector, a television output connector, and control electronics. The control electronics are connected to the television antenna connector, the signal strength display, the channel display, and to the channel select switch. The control electronics performs a high speed scan of less than ten seconds and displays the selected channel in the channel display as well as its signal strength for any antenna signal on the television antenna connector. The control electronics delivers the antenna signal for the selected channel to the television output connector. In other modes of use, the user can scan for all available channels, scan for channels in a selected band of frequencies, perform a seek of available channels, etc.

The summary set forth above does not limit the teachings of the invention especially as to variations and other embodiments of the invention as more fully set out in the following description taken in connection with the accompanying drawings.

BRIEF DESCRIPTION OF THE DRAWINGS

The present invention can be more readily understood in conjunction with the accompanying drawings, in which.

DETAILED DESCRIPTION OF THE INVENTION

Figure 1:
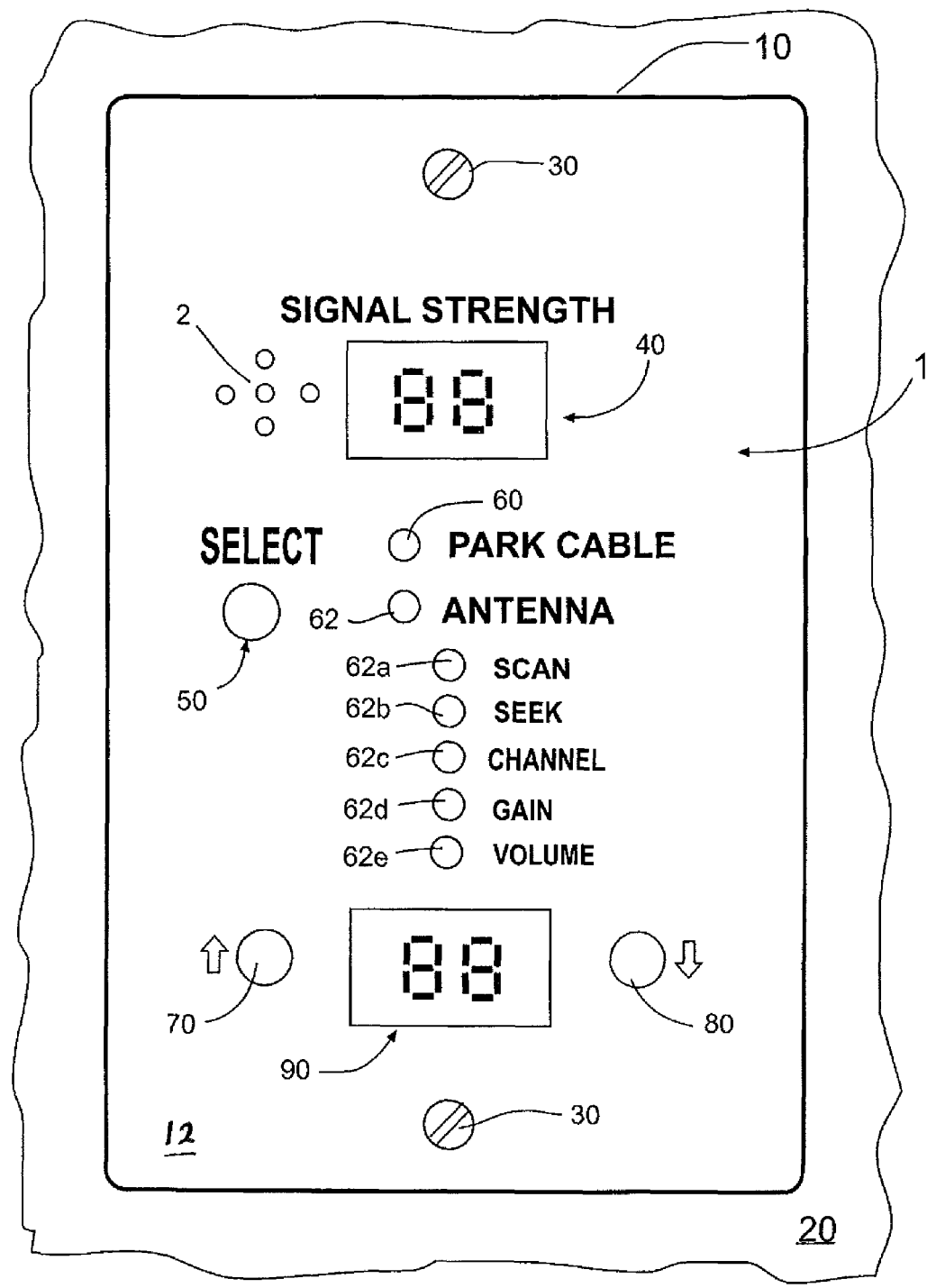
FIG. 1 is a front planar view of the wall plate of the invention.
Figure 4:
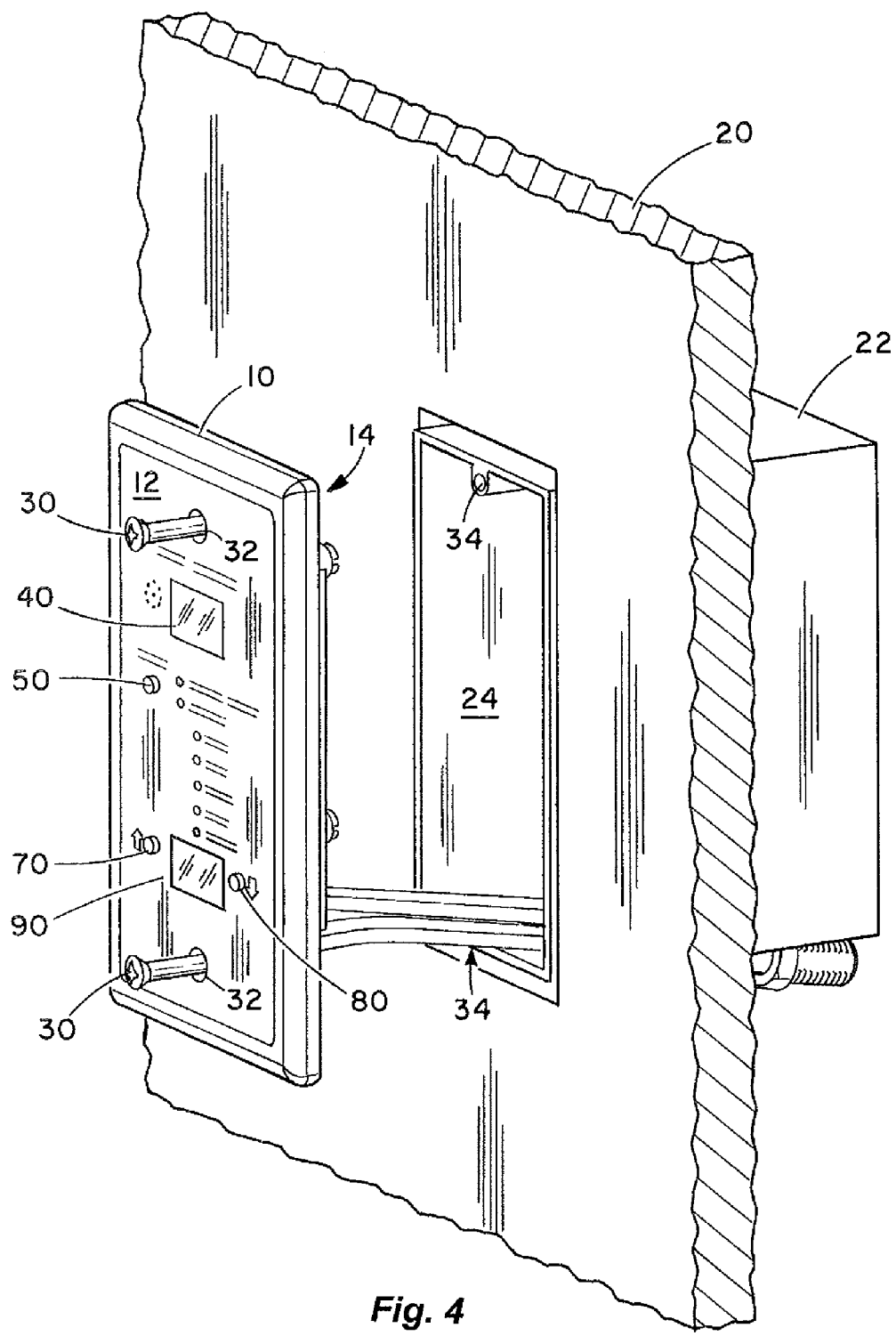
FIG. 4 is an exploded perspective view showing the insertion of the wall plate of FIG. 1 into an opening in a wall.
Figure 5:
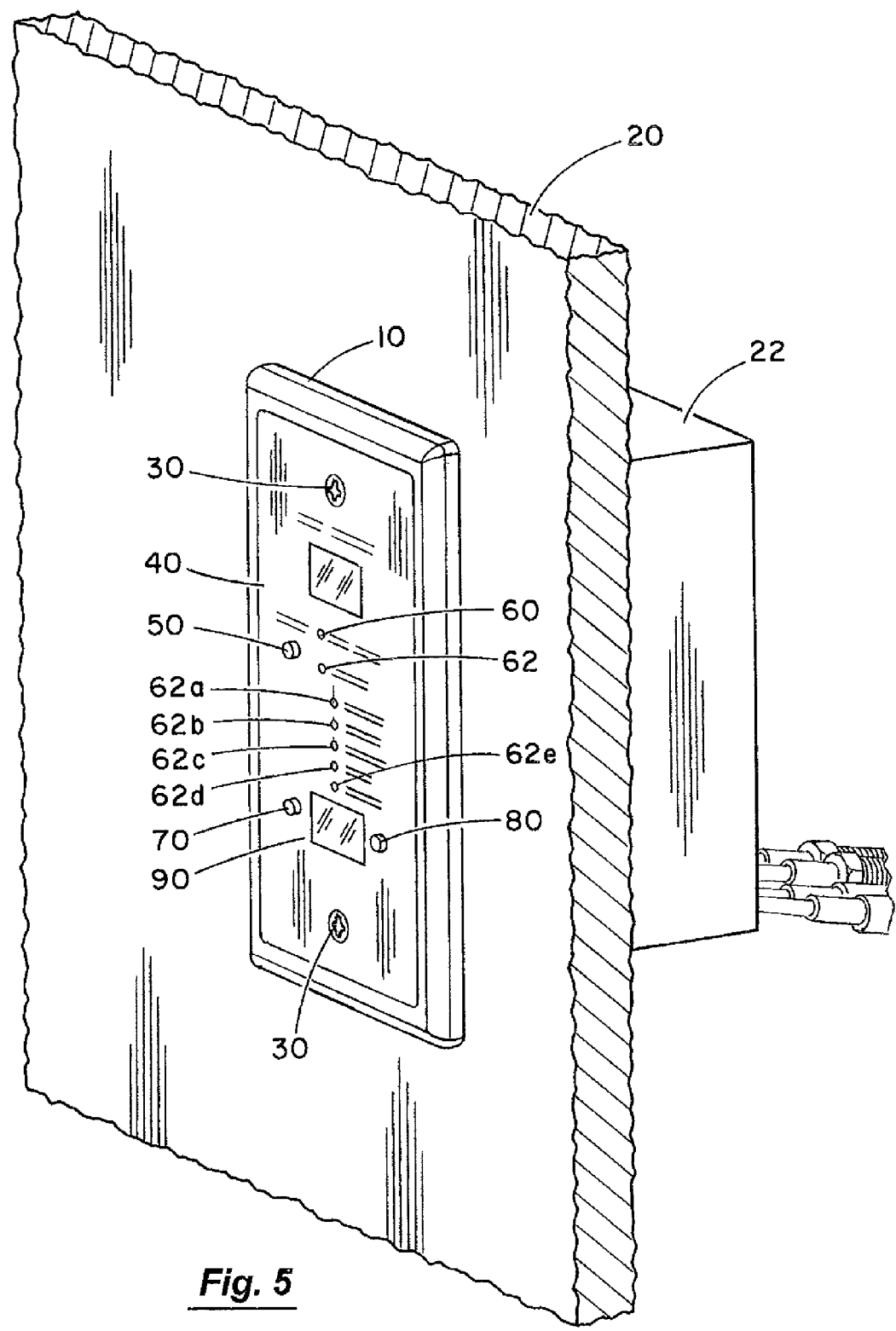
FIG. 5 is a perspective corresponding to FIG. 4 showing the wall plate attached to the wall.

FIGS. 1, 4 and 5 show the wall plate assembly 1 of the invention having a wall plate 10 mounted to a wall 20 such as a wall (or other suitable solid structure such as a partition, a divider, a housing, etc.) in an RV or other mobile vehicle, a residential house or other building, etc. The wall plate 10 has a front side 12 and a rear side 14. A pair of conventional screws 30 are used to conventionally mount the wall plate 10 into a conventional wall box 22 in the wall 20. The wall plate 10 is of conventional size such as, for example, about 3 by 5 inches. As shown in FIG. 4, each screw 30 passes through a formed hole 32 in the wall plate 10 to engage a threaded hole 34 in the wall box 220. The wall box 22 has a formed cavity 24 which receives a housing (not shown) affixed to the rear 14 of the wall plate 10.

On the front 12 of the wall plate 10 are located: a two-digit signal strength display 40, a Select push-button switch 50, a series of lights 60, 62, 62a, 62b, 62c, 62d and 62e, an Up push-button switch 70, a Down push-button switch 80, and a two-digit channel display 90. The layout shown in FIG. 1 is only an illustration as any convenient layout of displays, push-button switches, and lights could be mounted through openings in the wall plate 10. Also the signal strength display 40 could be more or less than two digits. For example, the display 40 could be a bar display with a series of lights showing increasing signal strength, or even a meter. Preferably the signal meter displays the signal strength as a percentage between 0 and 99. The channel display 90 can be used to display a wide band of channels (2-51), a range of bands (e.g. channels 2-10, 11-20, 21-30, 31-40, and 41-51) or a single channel.

Figure 2:
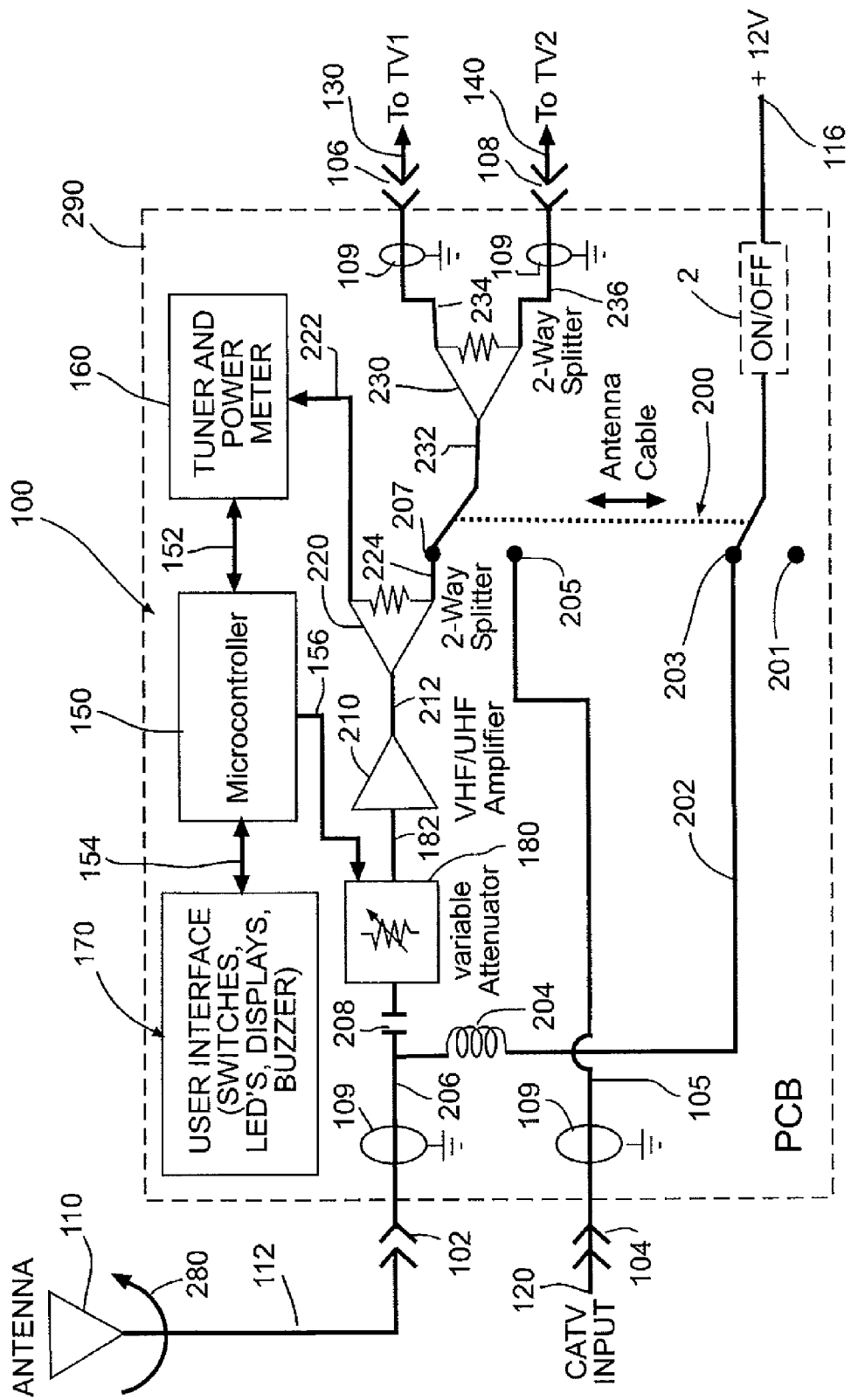
FIG. 2 is the component diagram of the signal meter system of the invention mounted to the wall plate of FIG. 1.

In FIG. 2, the control electronics 100 of the invention mounted on a printed circuit board (PCB) 290 is shown. The control electronics 100 connects through an F-connector 102 to a coax cable 112 from the directional antenna 110, connects through an F-connector 104 to a CATV coax cable 120, connects through an F-connector 106 to a first TV coax cable 130, and connects through an F-connector 108 to a second TV coax cable 140. Each F-connector 102, 104, 106, and 108 is grounded 109 as shown. All of these connections occur on the rear 14 of the wall plate 10 and are hidden from view when the wall plate 10 is mounted to wall 20. All cables 112, 120, 130 and 140 are located in the wall 20. Instead of using F-connectors, the cables can be soldered directly to the PCB 290. Less or more than two TVs can be connected. The CATV connection 104 is optional. Power (such as 12 volts) is delivered over line 116 from a source which may be external to the wall plate 10, as shown, such as from the battery of the RV or which may be internal such as from a battery located on the rear of the wall plate 10 (not shown).

In FIG. 2, the details of the control electronics 100 are set forth. A microcontroller 150 is shown connected 152 to the tuner and power meter 160, connected 154 to a user interface 170, and connected 156 to a variable attenuator 180. The tuner and power meter 160 is conventionally available as NXP TDA18219CN, www.nxp.com (NXP B.V.). The microcontroller 150 is conventional such as LPC 1114FBD48/301,1 also from NXP.

The variable attenuator 180 is of conventional design based on a PIN diode such as Infineon Part Number BAR61E6327XT (640 N. McCarthy Blvd., Milpitas, Calif. 95035). The user interface 170 includes the signal strength display 40, the Select button switch 50, the lights 60, 62, and 62a through 62e, the Up button switch 70, the Down button switch 80, and the channel display 90.

Also in FIG. 2, DC power 116 is delivered through switch 200 to line 202 at node 203 through inductor 204 and over cables 206 and 112 to the antenna 110 when the switch 200 is in the first position as shown. Capacitor 208 blocks the power from being delivered into the variable attenuator 180. Inductor 204 blocks the RF signal from the DC power line 202. When the switch 200 is in the second position, the power is terminated at node 201. When the switch 200 is in the first position as shown the control electronics 100 delivers signals from the antenna 110 through node 207 to the televisions TV1 and TV2. When the switch 200 is in the second position, the control electronics 100 deliver the CATV signals through node 205 to televisions TV1 and TV2.

The variable attenuator 180, as shown in FIG. 2, connects 182 to a VHF/UHF amplifier 210 which in turn connects 212 to a first two-way splitter 220. One output 222 of splitter 220 is connected to the tuner and power meter 160 and the other output 224 is connected to node 207 of switch 200. A second two-way splitter 230 has its input 232 connected to switch 200 to receive either the signal from node 205 (CATV) or node 207 (antenna). One output 234 is delivered to the first television TV1 and the other output 236 of splitter 230 is delivered to the second television TV2. The amplifier 210, switch 200 and each splitter 220 and 230 are conventional, for example the amplifier is Avago part number MSA-1105 (350 W. Trimble Road, Building 90, San Jose, Calif. 95131).

Figure 3:
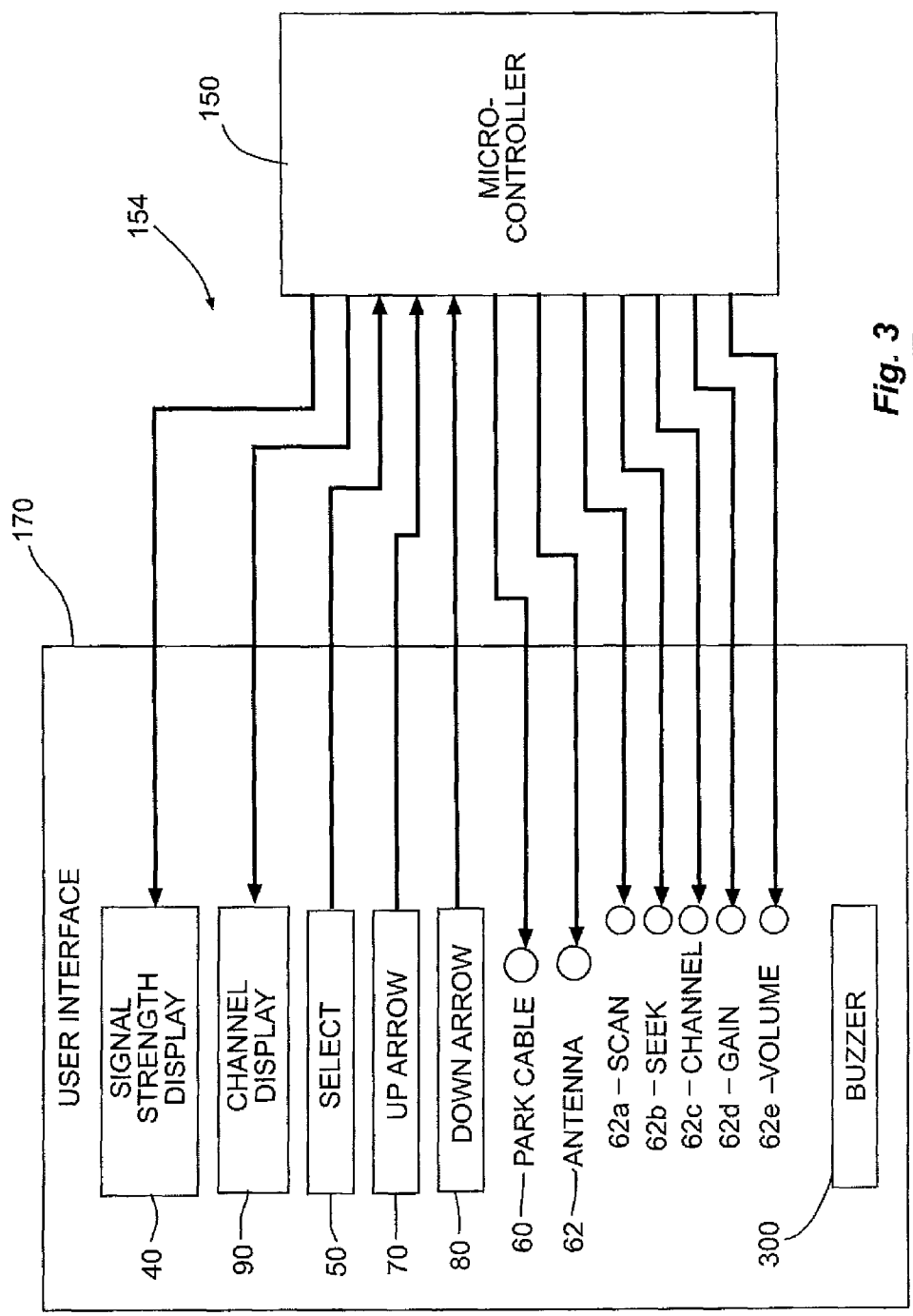
FIG. 3 is a block diagram showing the components of the user interface connected to the microcontroller.

FIG. 3 sets forth the details of the user interface 170. The microcontroller 150 delivers data to be displayed in displays 40 and 90; receives user inputs from switches 50, 70 and 80; selectively turns on light emitting diodes (LEDs) 60, 62 and 62a through 62e; and activates the audio buzzer 300. The interconnections 154 with the microcontroller 150 are conventional as are the use of conventional displays, buttons, lights and audio buzzer. The wall plate box 22 is deep enough to provide room for the control electronics 100.

The operation of the control electronics 100 is discussed next. The control electronics 100 has two primary functional modes as shown by the Park Cable light 60 and the Antenna light 62 in FIGS. 1 and 3. Within the "Antenna" primary mode are five sub-modes as shown by the Scan light 62a, the Seek light 62b, the Channel light 62c, the Gain light 62d and the Volume light 62e. To support these functionalities, three switches (Select 50, Up 70 and Down 80) are provided on the face of the wall plate 10 to receive user input. The Select switch 50 is used to navigate between the two primary modes (i.e., Park Cable and Antenna) and the five sub-modes of Antenna. The Up and Down switches 70 and 80 are used to navigate within the five sub-modes when the Antenna primary mode is selected.

In particular, the Select switch 50 can be employed to cycle through the available operational modes and sub-modes. The control electronics 100 lights the corresponding LEDs 60, 62 and 62a-62e as the Select switch 50 is pressed to indicate to the user which operational mode or sub-mode is currently selected and active. The Up and Down switches 70, 80 are then used to receive user input and navigate within the five sub-modes when the Antenna primary mode is selected. For example, the Up and Down switches 70, 80 can be used to select a television channel when in the Antenna-Channel sub-mode, or to increase or decrease the audio volume in the Antenna-Volume sub-mode. Each of the operational modes and sub-modes are discussed in detail below.

In the "Park Cable" primary functional mode, the signal meter functionality of the invention is disabled and only light 60 is lit on the front of the wall plate 10. Here, and as shown in FIG. 2, the switch 200 under control of the microcontroller 150 connects only the CATV input 120 to the two television outputs 106 and 108. Here, the user pushes the Select switch 50 to light the Park Cable light 60. The select button 50 is in the user interface 170 of FIG. 2 and the selection of Park Cable primary functional mode by the user is detected by the microcontroller 150 over 154. The microcontroller 150 then causes switch 200 to connect line 232 to node 205 and the CATV signal is delivered to televisions TV1 and TV2 bypassing the power meter circuitry. The "Park Cable" primary function and associated circuitry are optional.

In the "Antenna" primary functional mode, the signal meter functionality is fully enabled and the Antenna light 62 is lit as well as one of the applicable sub-mode lights 62a, 62b, 62c, 62d or 62e. The antenna 110 input signal 112 is transferred to the two television outputs 106 and 108 while maintaining the gain/attenuation setting previously established via the Antenna-Gain option as will be discussed later. Here, the user pushes the Select button 50 until the Antenna light 62 is lit. The select switch 50 is in the user interface 170 of FIG. 2 and the selection of Antenna primary mode by the user is detected by the microcontroller 150 over 154. The microcontroller 150 then causes switch 200 to connect line 232 to node 207 and the antenna signal is delivered to televisions TV1 and TV2 while accessing the power meter circuitry. The user can now press the Select button 50 to light lights 62a through 62e during which time the Antenna light 62 stays lit. The user selects which sub-mode to enter in this fashion and whatever sub-mode is selected, the microcontroller 150 detects it, lights the appropriate light 62a-62e in the user interface 170, and performs the sub-mode function selected by the user.

In the preferred embodiment of the present invention, the wall plate 10 is equipped with two LEDs 62a and 62b indicating the "Scan" and "Seek" sub-modes under the Antenna primary mode LED 62. To select one of these sub-modes, the user presses the Select button 50 an appropriate number of times until either the Seek LED 62b or the Scan LED 62a is lit.

In the Scan sub-mode indicated by Scan light 62a, the microcontroller 150 displays "-" in the channel display 90 while it scans all channels 2-51. When the scan is completed, the channel with the highest signal strength is displayed, along with the active signal level of that channel. Pressing either the Up or Down buttons 70, 80 causes a new scan to be initiated. This will display the strongest channel the antenna is currently receiving. It is possible that the same channel could not be displayed. If nothing ("-") is showing in the signal strength display 40, then no channels are available, and the gain should be checked.

In the Seek sub-mode, individual channels are scanned in sequence by the microcontroller 150 looking for signal strength above a predetermined threshold. If a channel is found above the predetermined threshold, seek stops and the microcontroller 150 displays the channel number in display 90 and the signal strength in display 40. The microcontroller 150 then waits for further user input. This gives the user the option of tuning the antenna 110 by turning 280 to maximize signal strength for this channel. If this channel is of no use to the user, the Up/Down buttons 70, 80 are pressed again and the Seek sub-mode continues until the next channel is found. If the Up button 70 is pressed, the microcontroller 150 continues searching for signals while incrementing channels. Once the next valid signal is found, the microcontroller 150 stops scanning and displays the current channel and the active signal level for that channel. If the Down button 80 is pressed, the microcontroller 150 searches for the next valid signal while decrementing channels. When the next valid signal is found, the microcontroller 150 stops scanning and displays the current channel and the active signal level for that channel.

In one embodiment of the present invention, the Seek and Scan sub-modes use separate Seek and Scan buttons (not shown) on the face of the wall plate 10. In another variation, a single Seek/Scan button could be used with the Seek LED 62b and the Scan LED 62a placed near the Seek/Scan button. In another variation, only one of these two sub-modes is implemented.

In the Antenna-Channel sub-mode 62c, the current channel is displayed on display 90 and the user can select any other desired TV channel (2-51) using the Up/Down switches 70, 80. After a short delay, channel signal strength is measured by the tuner and power meter 160 under control of the microcontroller 150 and fed back to the user via the Signal Strength display 40. In addition, if the channel signal strength exceeds an audio "squelch" threshold, the microcontroller 150 causes a tone to be played on buzzer 300 in the user interface 170. The frequency and amplitude of the tone vary to indicate increasing or decreasing measured signal strength. The channel signal strength is measured quickly (~60 milliseconds) by the microcontroller 150, so that the user can get real-time feedback as the user rotates the antenna 110 in the direction of arrow 280 at a moderate speed as shown in FIG. 2. It is to be understood that the antenna 110 in RVs can be manually or automatically moved with a conventional mechanism inside the RV.

In the Antenna-Gain sub-mode indicated by the Gain light 62d, the current gain setting is displayed on display 90 and the user can adjust the gain of the Antenna signal from ~0 to +20 db via the Up/Down switches 70 and 80.

In the Antenna-Volume sub-mode indicated by Volume light 62e, the current audio buzzer 300 volume setting is displayed on display 90 and the user can adjust the volume from 0 to 10 via the Up/Down switches 70 and 80.

Optionally, the present invention can include an Antenna-Band sub-mode (not shown). In this sub-mode, the current band is displayed on display 90. The user can select a "band" of TV channels using the Up/Down buttons 70, 80. For example, band 00 could be all channels: 2-51; band 01 could be channels: 2-10; band 02 could be channels 11-20; band 03 could be channels 21-30; band 04 could be channels 31-40 and band 15 could be channels 41-51. The breakdown of the bands can be any group of channels with any corresponding displayed band code (such as: 00, 01, 02, 03, etc.). Each pre-defined "band" contains multiple TV channels that will be rapidly and continuously sampled for signal strength by the microcontroller 150. If the signal strength for a particular channel in the band selected exceeds a target threshold, the channel number (2-51) and corresponding signal strength are displayed on displays 90 and 40 respectively. In addition, if the channel signal strength exceeds the audio "squelch" threshold, a tone is played on the audio buzzer 300. The frequency and amplitude of the tone vary to indicate increasing or decreasing signal strength. Because scanning a band of channels requires a proportionally longer period of time, the user must rotate 280 the antenna 110 at a very slow speed or rotate 280 the antenna 110 by a small "delta" angle and wait for feedback.

In the optional Band sub-mode, in order to perform a scan of all channels, the user pushes the Select button 50 to cycle through the available sub-modes until the Band LED is lit. The user then uses the Up/Down buttons 70, 80 to display "00" in display 90. The control electronics 100 responds to the user input and begins scanning all ATSC channels 2-51. The selected full scan takes approximately three seconds or less to complete if no signals are present. If a signal is found, the scan stops and the signal strength and channel are displayed in displays 90 and 40 respectively. All available channels are found in this manner and the user can write each channel down on a list with the signal strengths before moving the antenna to a new orientation. At the new antenna orientation, the process is repeated to determine whether the signal strengths improved or deteriorated, and if any new channels were observed. Once that data is recorded, a new antenna position is tried, and the scan repeats. One method is to orient the antenna in separate ninety degree antenna adjustments for the initial four scans. Then the user has now has a list of channels and relative signal strengths. At that point, the user can move the antenna toward the general direction of most/best signals and fine tune the antenna using the present invention on one or more of the signals to get peak signal strength. Once that is accomplished, the user runs the TV's tuner scan to add the channels for viewing.

There could also be a case where the user was already familiar with the area and knew what the available channel(s) are. In that case, the user would select 50 the Channel sub-mode and would push the Up/Down buttons 70, 80 to get to that channel. The user would then rotate the antenna for maximum signal strength. The TV tuner would still have to be scanned to add the channel to the television set.

Figure 10:
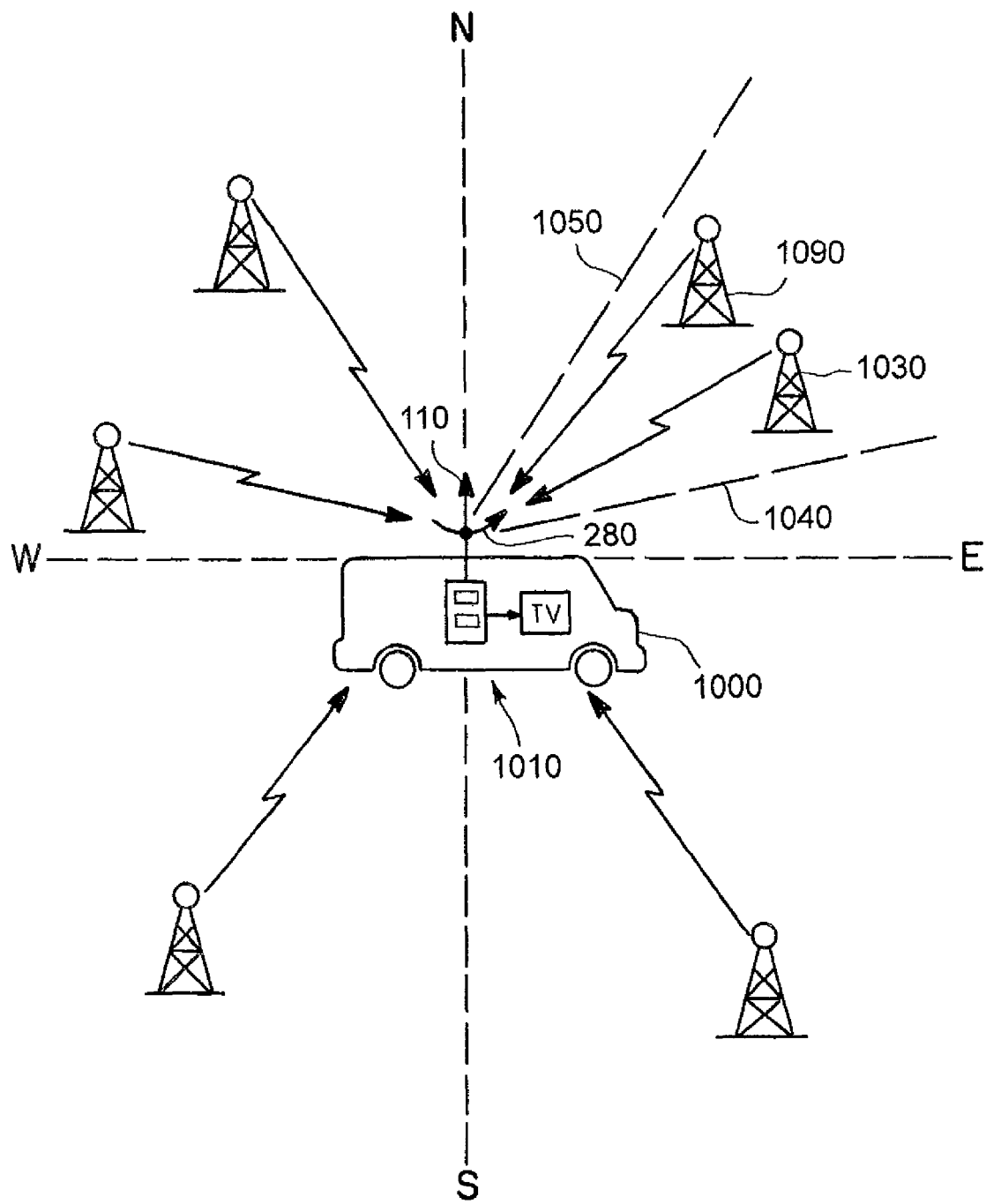
FIG. 10 is an example of a parked RV at a location illustrating the use of the wall plate assembly to detect a desired channel(s) for viewing.
Figure 11:
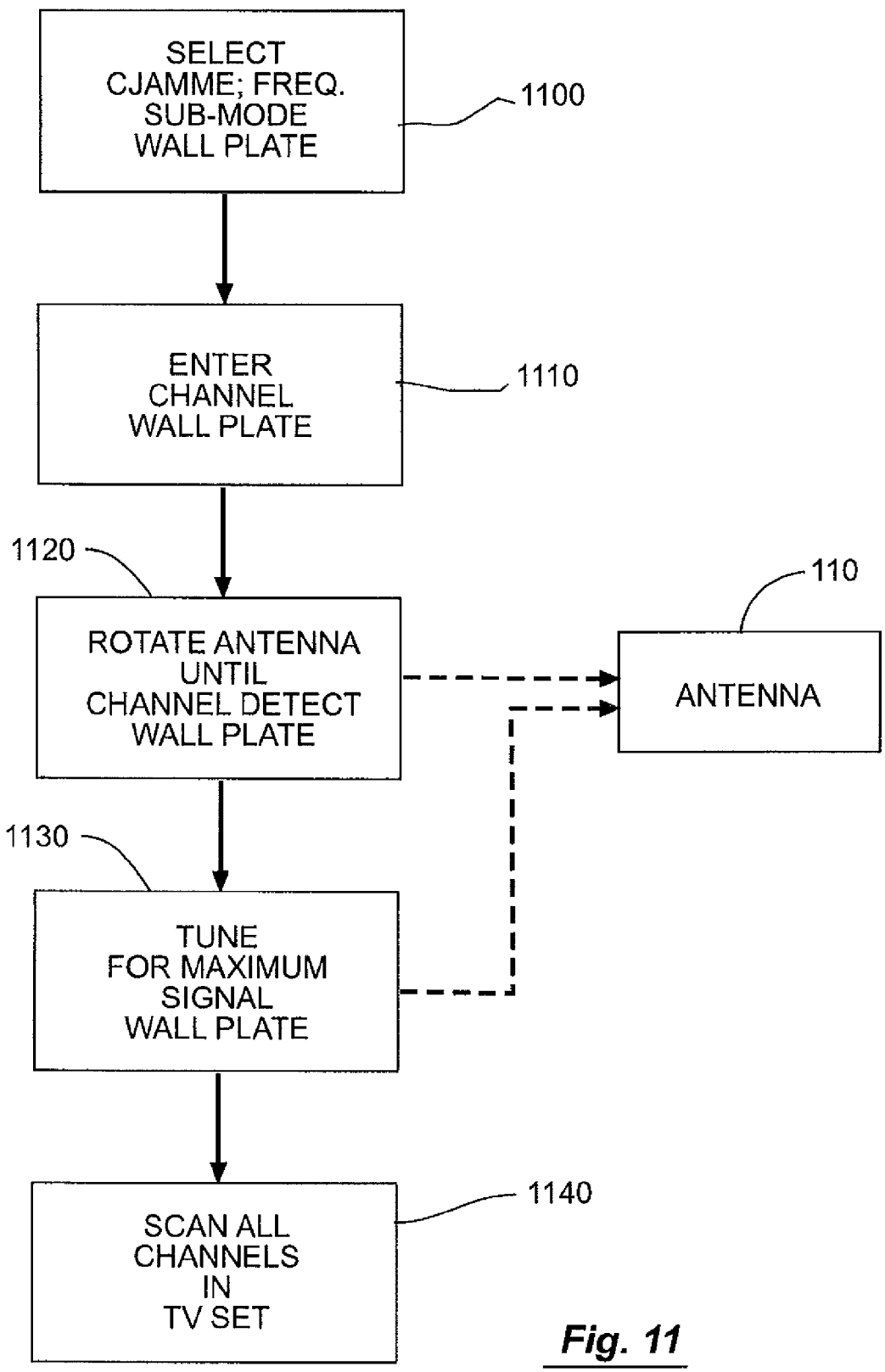
FIG. 11 sets forth a method of the invention based on the example of FIG. 10.

For example, in FIG. 11, the method for a user seeking a specific channel is shown. The user parks the RV 1000 at a location 1010 such as at Burlington, Iowa, as illustrated in FIG. 10. The user, in this example, has favorite programming on ABC and an ABC affiliate, WQAD, has a broadcast tower located at 1030. A number of other broadcast towers for other digital TV stations are located around the parked RV 1000. The user selects the Channel sub-mode by pressing the Select button 50 the appropriate number of times to light the Channel LED 62c in step 1100. The user then uses the Up/Down buttons 70, 80 to enter the RF channel number 38 for WQAD in display 90 in step 1110. Assume the antenna 110 is pointed in the SE quadrant of FIG. 10, the user moves the antenna 110 slowly in the direction of arrow 280 toward the east. The control electronics 100 is scanning for RF channel 38 and no signal strength is displayed in the signal strength meter 40 in step 1120. The user keeps slowly turning the antenna 110 in step 1120 and after the antenna enters the NE quadrant, the control electronics starts picking up the RF channel 38 signal for WQAD. When the signal exceeds a target threshold level such as when the antenna is pointed in direction 1040, the signal strength is displayed in the signal meter 1100. This is not peak signal strength and the user moves the antenna back and forth in step 1130 between the directions 1040 and 1050 until maximum signal strength is read or by listening to the tone variation of buzzer 300. Direction 1050 is the direction in which the signal again drops below the threshold value. With the antenna 110 set to receive the maximum signal strength for WQAD, the user uses the conventional scan function in TV set 1080 to scan all channels and to map any other channels, such as from tower 1090, that the antenna 110 receives in step 1140. The TV set 1080 will certainly scan and map received broadcast digital channel 38 as virtual channel 8. As the antenna 110 is a directional antenna, broadcast channels from quadrants NW and SW may not be detected by the TV scanner.

In the optional Band sub-mode discussed above, the user initially selects the Band LED (not shown) and then enters a code such as "00" in the display 90 via the Up/Down buttons 70, 80. The control electronics 100 is used to detect all of the broadcast towers in FIG. 10 (assuming a signal from each tower exceeds the threshold value). The user can write these down with the antenna orientation and then decide where to point the antenna 110 to receive his desired programming. Once pointed, the TV set 1080 would then conventionally scan for all received RF channels and perform the virtual channel mapping.

At power up, the control electronics 100 lights all of the lights 60, 62 and 62a through 62e for about two seconds and "chirps" the audio buzzer 300 to provide feedback to the user that all lights and the buzzer are functional. In addition, other hardware functionality will be verified. If an error condition is detected, the control electronics 100 will indicate an error code in display 90 that will aid the user and/or technical services personnel in determining the root cause of the issue. Upon successful completion of the self-test, the control electronics 100 reverts to the last known configuration. Power up can occur when the power is connected over line 116 from the vehicle battery or an internal battery. Power up can also occur if an on/off switch is provided on the front of the wall plate. Alternatively, the Select switch 50 can also be used to power up the device.

The wall plate assembly 1 of the invention can be design in one compact embodiment having a channel select switch or switches (e.g., Up and Down switched 70, 80) mounted through an opening of the wall plate 10 that are operative from the front 12 by a user to select a television channel. A channel display 90 is mounted through another opening of the wall plate 10 to display to the user the selected television channel. A signal strength display 40 is also mounted through an opening to display the signal strength for the displayed selected channel. A printed circuit board 290 mounted on the rear 14 of the wall plate 10 has a television antenna connector 102, a television output connector(s) 130, 140, and control electronics 100. The control electronics 100 are connected to the television antenna connector 109, the signal strength display 40, the channel display 90, and one or more channel select switches 70, 80. The control electronics 100 display the selected channel in the channel display, determine the signal strength for the selected channel in any antenna signal on the television antenna connector 102 and display it in the signal strength display 40. The control electronics 100 also delivers the antenna signal for the selected channel to the television output connector(s) 106, 108.

The wall plate assembly 1 set forth above can further provide the Antenna primary function only with any selection of sub-modes (for example, selection of sub-modes channel, gain, or volume). In this variation, the Up/Down buttons 70, 80 would be used to control the sub-mode operation. The wall plate assembly 1, in yet another variation, incorporates the Park Cable primary mode with the Antenna primary mode along with all or one or more of the sub-modes.

Figure 6:
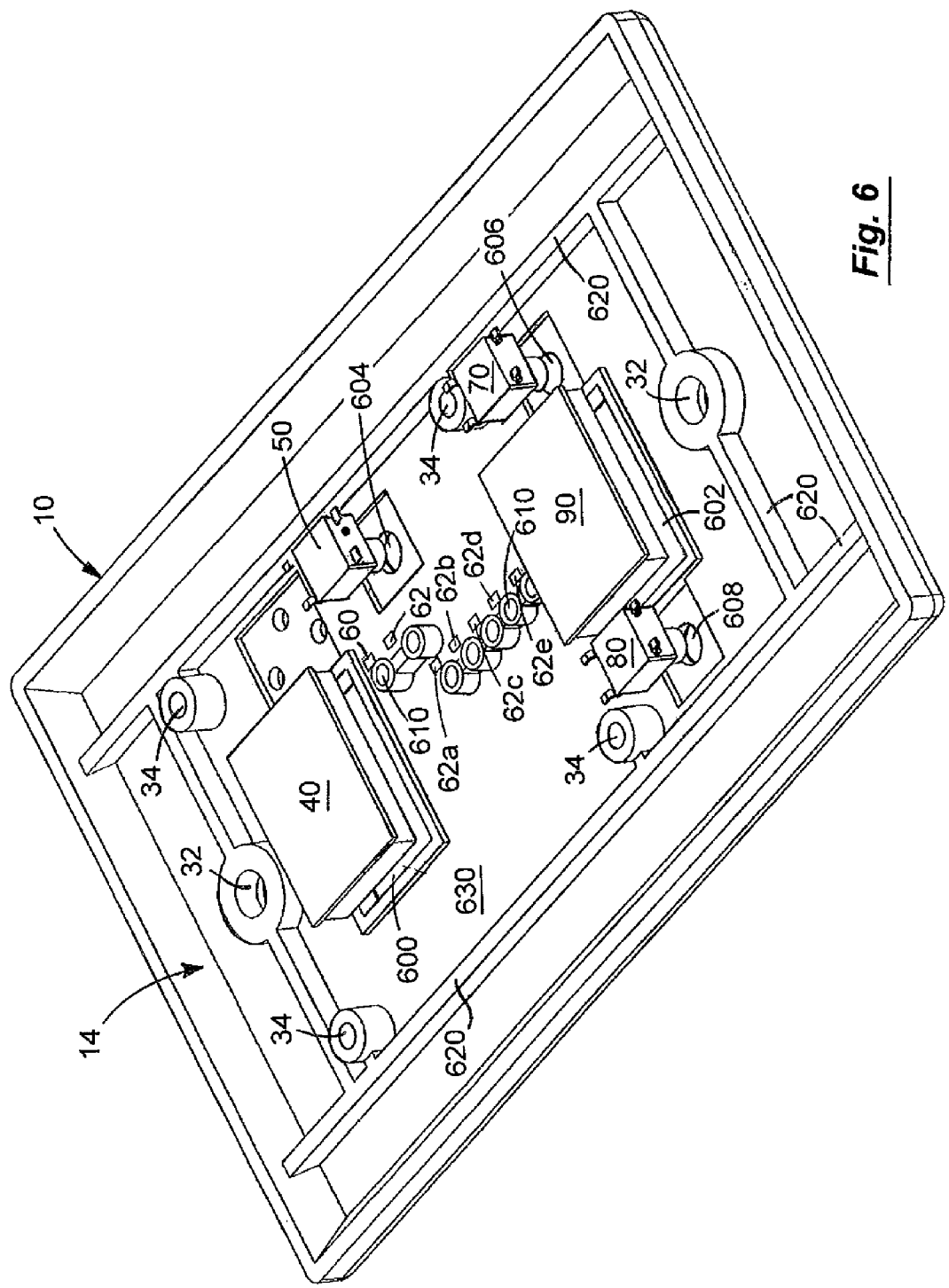
FIG. 6 is a perspective view of the rear side of the wall plate of FIG. 1.
Figure 8:
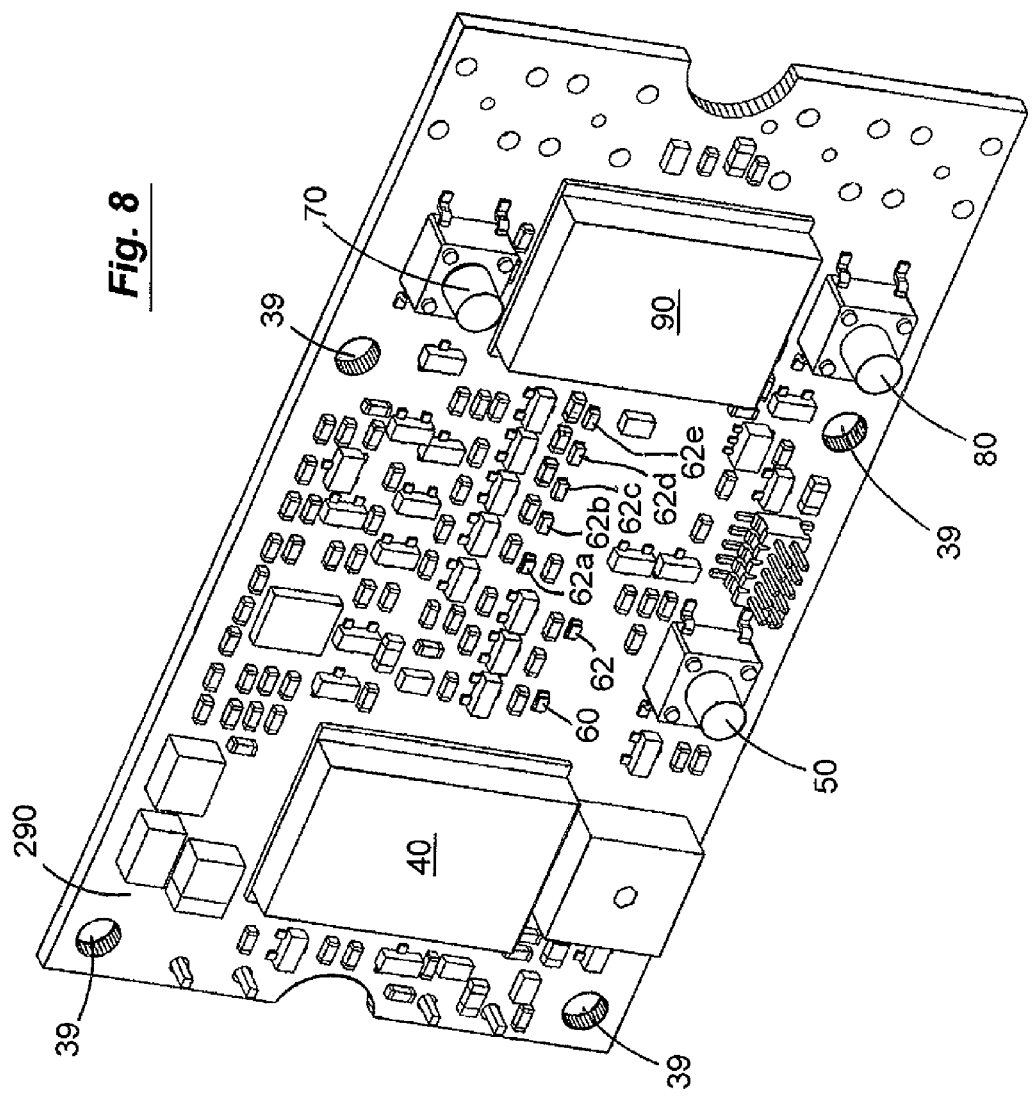
FIG. 8 is a perspective view of the printed circuit board showing the push-button switches, displays and lights.

In FIG. 6, the rear side 14 of the wall plate 10 is shown with a number of openings. The various components that go into the openings are shown somewhat spaced away to illustrate placement. These components are all mounted to one side of the PCB 290 as shown in FIG. 8. FIG. 6 shows that display 40 fits into opening 600, display 90 into opening 602, switch 50 into opening 604, switch 70 into opening 606, and switch 80 into opening 608. Each LED 60, 62, and 62a through 62e fit above the seven openings 610. The rear side 14 of the wall plate 10 has a number of support ribs generally shown as 620 that are formed within a rear cavity 630. The support ribs 620 and all of the openings can be any suitable design based on the layout of the displays, the switches, and the LEDs. An audio buzzer can also be mounted on the rear side 14 of the wall plate 10 behind a pattern of small openings 2 extending through the wall plate 10 to make the audio buzzer more audible.

Figure 7:
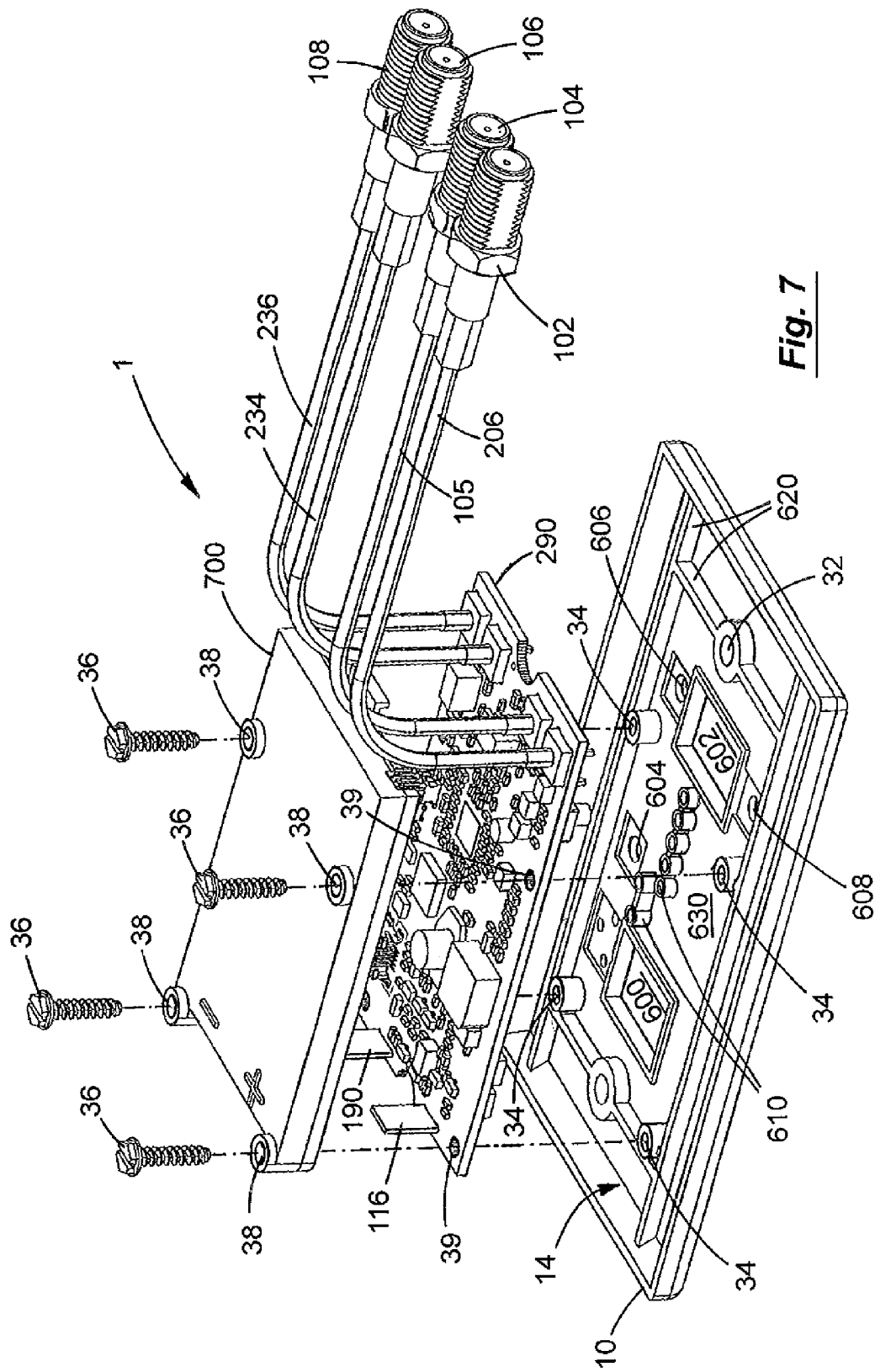
FIG. 7 is an exploded perspective view of the wall plate of the invention.
Figure 9:
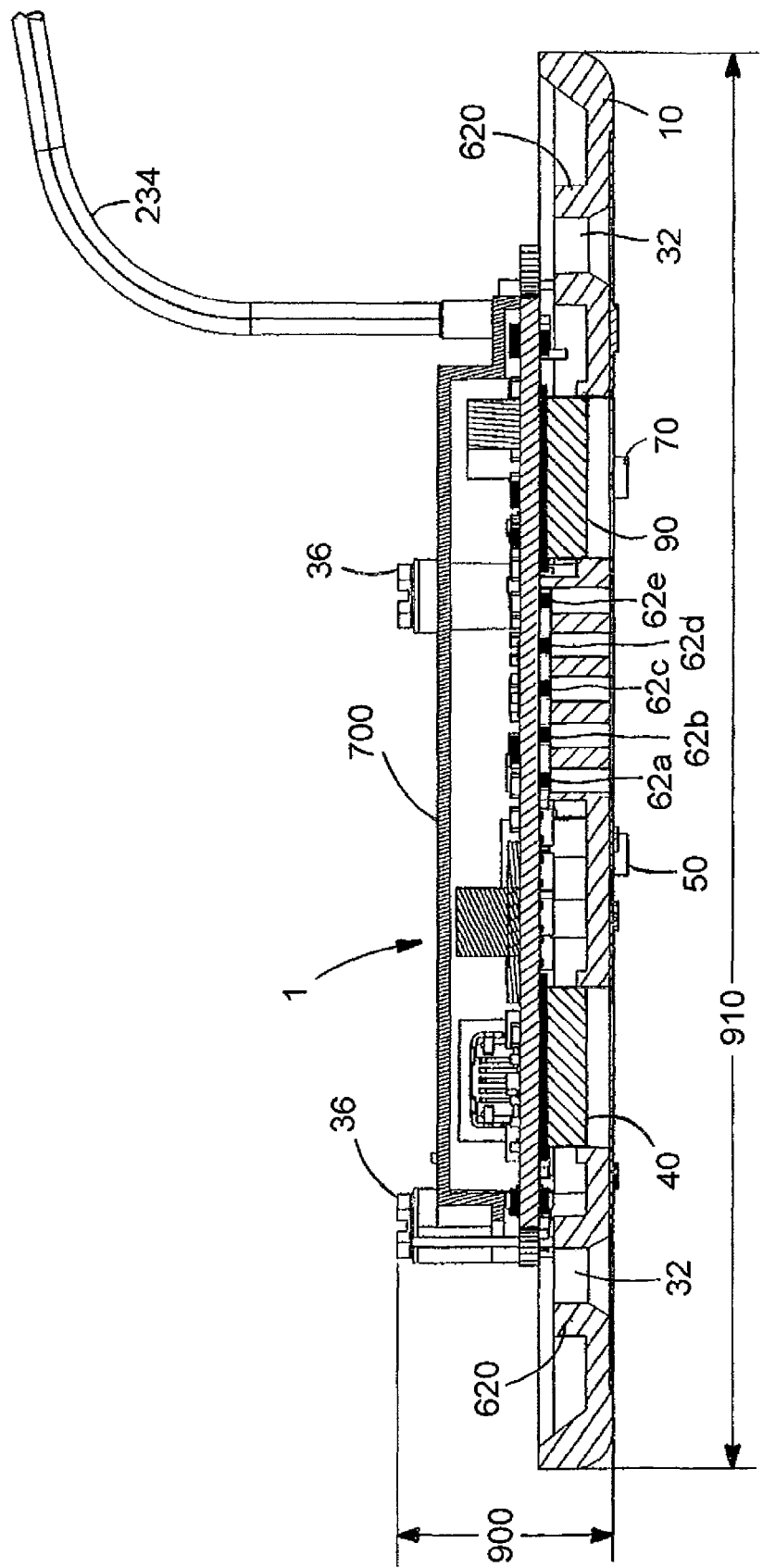
FIG. 9 is a cross-section view of the assembled wall plate of the invention.

FIG. 7 shows the connection of the PCB 290 to the rear side 14 of the wall plate 10. In this figure, the various openings discussed above are more clearly shown. A housing 700 has formed holes 38 which receive screws 36. Corresponding holes 39 are formed in the PCB 290. And, corresponding threaded holes 34 are formed in the rear side 14 of the wall plate 10. When the screws 36 are inserted through holes 38 and 39, they are tightened in holes 34 to firmly affix the PCB 290 and housing 700 in the cavity 630 defined by the support ribs 620 as shown in FIGS. 7 and 9. The cables 206 (TV antenna input), 105 (CATV input), 234 (TV1 output) and 236 (TV2) are flexible and are shown connected to the PCB 290. Power and ground is delivered over spade lugs 116 and 190. Again, the configuration shown is adapted for the layout of FIG. 1 and other configurations could be used. The wall plate assembly 1 has a compact depth 900 of 0.69 inches and a length 910 of 4.50 inches in this embodiment, as shown in FIG. 9.

Certain precise dimension and values have been utilized in the specification. However, these dimensions and values do not limit the scope of the claimed invention and thus variations in angles, spacing, dimensions, configurations, and shapes can occur. It is noted that the terms "preferable" and "preferably," are given their common definitions and are not utilized herein to limit the scope of the claimed disclosure. Rather, these terms are intended to highlight alternative or additional features that may or may not be utilized in a particular embodiment of the present disclosure. For the purposes of describing and defining the present disclosure it is noted that the term "substantially" is given its common definition and it is utilized herein to represent the inherent degree of uncertainty that may be attributed to any shape or other representation.

Those skilled in this art will appreciate that various changes, modifications, use of other materials, other structural arrangements, and other embodiments could be practiced under the teachings of the invention without departing from the scope of this invention as set forth in the following claims.

We claim:

1. A wall plate assembly comprising:
   a wall plate having front and rear sides;
   at least one channel select switch mounted through an opening of the wall plate and operative from the front side to select a television channel;
   a channel display mounted through an opening of the wall plate to display the selected television channel on the front side;
   a signal strength display mounted through an opening of the wall plate to display signal strength for the selected channel on the front side;
   a circuit board mounted to the rear side of the wall plate;
   a television antenna connector on the circuit board; and
   a television output connector on the circuit board;
   said circuit board having control electronics connected to the television antenna connector, signal strength display, channel display and channel select switches; said control electronics displaying the selected channel in the channel display; said control electronics determining the signal strength for the selected channel in any signal on the television antenna connector for display in the signal strength display; said control electronics delivering the signal for the selected channel to the television output connector.

2. The wall plate assembly of claim 1 further comprising at least one select switch mounted through openings of the wall plate to receive user input determining the operational mode of the control electronics from the front side of the wall plate.

3. The wall plate assembly of claim 2 further comprising a plurality of mode lights mounted through openings in the wall plate to indicate the operational mode of the control electronics.

4. A signal meter wall plate assembly connecting to a wall box located in a wall, said signal meter wall plate assembly comprising:
   a wall plate having front and rear sides with a plurality of openings therein;
   control electronics fastened on the rear of the wall plate and configured to fit within the wall box when the wall plate is attached to the wall box, said control electronics having an antenna input and at least one television output; said control electronics determining the signal strength for the selected channel in the antenna input;
   a signal strength display connected to the control electronics and mounted through one of the openings of the wall plate to display signal strength on the front side;
   a channel display connected to the control electronics and mounted through one of the openings of the wall plate to display selected channel numbers on the front side; and
   at least one select switch mounted through one of the openings of the wall plate to receive user input for the control electronics from the front side.

5. The signal meter wall plate assembly of claim 4 further comprising a Park Cable light mounted through one of the openings of the wall plate to light from the front side indicating a mode of operation in which the signal strength functionality is disabled.

6. The signal meter wall plate assembly of claim 4 further comprising an Antenna light mounted through one of the openings of the wall plate to light from the front side indicating a mode of operation in which the antenna input signal is transferred to at least one of the television outputs of control electronics.

7. The signal meter wall plate assembly of claim 4 further comprising a Scan light mounted through one of the openings of the wall plate to light from the front side indicating a mode of operation in which channels are scanned by the control electronics looking for the channel having the highest signal strength.

8. The signal meter wall plate assembly of claim 4 further comprising a Seek light mounted through one of the openings of the wall plate to light from the front side indicating a mode of operation in which channels are scanned in sequence by the control electronics looking for the next channel having a signal strength above a predetermined threshold.

9. The signal meter wall plate assembly of claim 4 further comprising a Channel light mounted through one of the openings of the wall plate to light from the front side indicating a mode of operation in which a television channel is selected by the user.

10. The signal meter wall plate assembly of claim 4 further comprising a Gain light mounted through one of the openings of the wall plate to light from the front side indicating a mode of operation in which a gain setting is selected by the user.

11. The signal meter wall plate assembly of claim 4 further comprising a Volume light mounted through one of the openings of the wall plate to light from the front side indicating a mode of operation in which a volume setting is selected by the user.

12. The signal meter wall plate assembly of claim 4 wherein the select switches comprise an Up button and a Down button mounted through openings of the wall plate to operate from the front side.

\* \* \* \* \*